(12) United States Patent
Burke et al.

(10) Patent No.: US 9,047,172 B2
(45) Date of Patent: Jun. 2, 2015

(54) ADAPTIVE POWER CONTROL OF MEMORY MAP STORAGE DEVICES

(71) Applicant: Intel Corporation, Santa Clara, CA (US)

(72) Inventors: Nathaniel G. Burke, Hillsboro, OR (US); Sanjeev N. Trika, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 246 days.

(21) Appl. No.: 13/688,546

(22) Filed: Nov. 29, 2012

(65) Prior Publication Data

US 2014/0149640 A1    May 29, 2014

(51) Int. Cl.
*G06F 12/00* (2006.01)
*G06F 12/02* (2006.01)
*G06F 1/32* (2006.01)

(52) U.S. Cl.
CPC ............ *G06F 12/02* (2013.01); *G06F 12/0246* (2013.01); *G06F 1/32* (2013.01); *G06F 2212/1028* (2013.01); *G06F 2212/7201* (2013.01); *G06F 1/3225* (2013.01); *G06F 1/3275* (2013.01)

(58) Field of Classification Search
None
See application file for complete search history.

(56) References Cited

U.S. PATENT DOCUMENTS

| | | |
|---|---|---|
| 5,566,314 A | 10/1996 | DeMarco et al. |
| 5,630,093 A | 5/1997 | Holzhammer et al. |
| 8,321,652 B2 * | 11/2012 | Hinz .............................. 711/206 |
| 2002/0099904 A1 | 7/2002 | Conley |
| 2003/0101327 A1 | 5/2003 | Beck |
| 2003/0163594 A1 | 8/2003 | Aasheim et al. |
| 2003/0189860 A1 | 10/2003 | Takeuchi et al. |
| 2004/0168018 A1 | 8/2004 | Aasheim et al. |
| 2007/0005928 A1 | 1/2007 | Trika et al. |
| 2007/0094445 A1 | 4/2007 | Trika et al. |
| 2009/0157950 A1 * | 6/2009 | Selinger ........................ 711/103 |
| 2010/0332730 A1 | 12/2010 | Royer, Jr. et al. |
| 2013/0145081 A1 * | 6/2013 | Miura et al. .................. 711/103 |
| 2014/0006701 A1 * | 1/2014 | Condit et al. ................. 711/105 |

* cited by examiner

*Primary Examiner* — Brian Peugh
(74) *Attorney, Agent, or Firm* — Chapin IP Law, LLC

(57) ABSTRACT

An apparatus includes a storage resource to store data. The data can be accessible by a host computer system. The apparatus includes a set of dynamically powered volatile memory devices that are configured to store mapping information. The mapping information maps logical addresses of received access requests to corresponding physical addresses of the storage resource to which the access requests pertain. In accordance with received mode setting information, the controller logic adaptively controls power settings of the volatile memory devices storing the mapping information. If an abundance of power such as 120 VAC power is available, more of volatile memory devices can be powered to store a greater portion of the mapping information. If only battery power is available, fewer than all of the volatile memory devices can be powered to store a smaller portion of the mapping information.

26 Claims, 6 Drawing Sheets

ADAPTIVE POWER CONTROL OF MEMORY MAP STORAGE DEVICES

TECHNICAL FIELD

Embodiments of the present disclosure generally relate to powering, configuration, reconfiguration, use, etc., of one or more memory devices to store mapping information.

BACKGROUND

Computer systems have long implemented use of memory devices to store data. One reason for the widespread use of non-volatile memory such as solid-state devices in lieu of rotating disk drives is speed. For example, access to data in non-volatile solid-state memory (e.g., a stationary physical circuit device) is typically much quicker than access to data stored in a disk (e.g., a physically rotating storage medium). A downside of using a non-volatile memory system in lieu of a spinning disk drive storage is cost. That is, the cost per bit to store data in non-volatile memory can be considerably higher than the cost per bit to store data in a disk drive.

Certain types of flash memory devices have been used in so-called SSD (Solid State Drive) devices. In certain instances, solid-state drives are used in lieu of spinning hard drives for the reasons as mentioned above. For example, solid state-drives offer very high-speed access.

In accordance with conventional computer systems that use a solid state-drive to store data, a respective host computer keeps track of stored data using logical addresses. Use of logical addresses to keep track of information alleviates the host computer from having to keep track of the specific physical addresses of data where corresponding data is actually stored.

A solid state-drive typically may include an access manager to store logical-to-physical address mapping information to convert logical addresses into respective physical addresses. That is, when a host computer desires to access a storage location corresponding to the logical address, a mapper resource converts the logical address to a corresponding physical address of the solid state-drive. Via use of the corresponding physical address, the solid state-drive is able to access the data on behalf of the host computer.

Certain solid state-drives include one or more DRAM (Dynamic Random Access Memory) devices to store the logical-to-physical address mapping information. For example, in accordance with conventional applications, the solid state-drive typically includes flash memory or other suitable non-volatile data storage resource to store the logical-to-physical address mapping information. Upon power up of a host computer, the access manager initiates a transfer of the logical-to-physical address mapping information stored in the flash memory to the one or more DRAM devices. Upon receiving an access request from the host computer, if possible, the access manager utilizes the logical-to-physical address mapping information stored in one or more DRAM devices to identify the appropriate physical address of the received request. If there is no entry in the one or more DRAM devices to map the logical address of the received access request to the appropriate physical address, in accordance with a so-called paging mode, the access manager initiates retrieval of the appropriate address mapping information from the non-volatile storage and stores it in the one or more DRAM devices. Thereafter, the appropriate entry in the one or more DRAM devices is used to map the logical address of the received request to a corresponding physical address.

DESCRIPTION OF THE EMBODIMENTS

Figure 1:
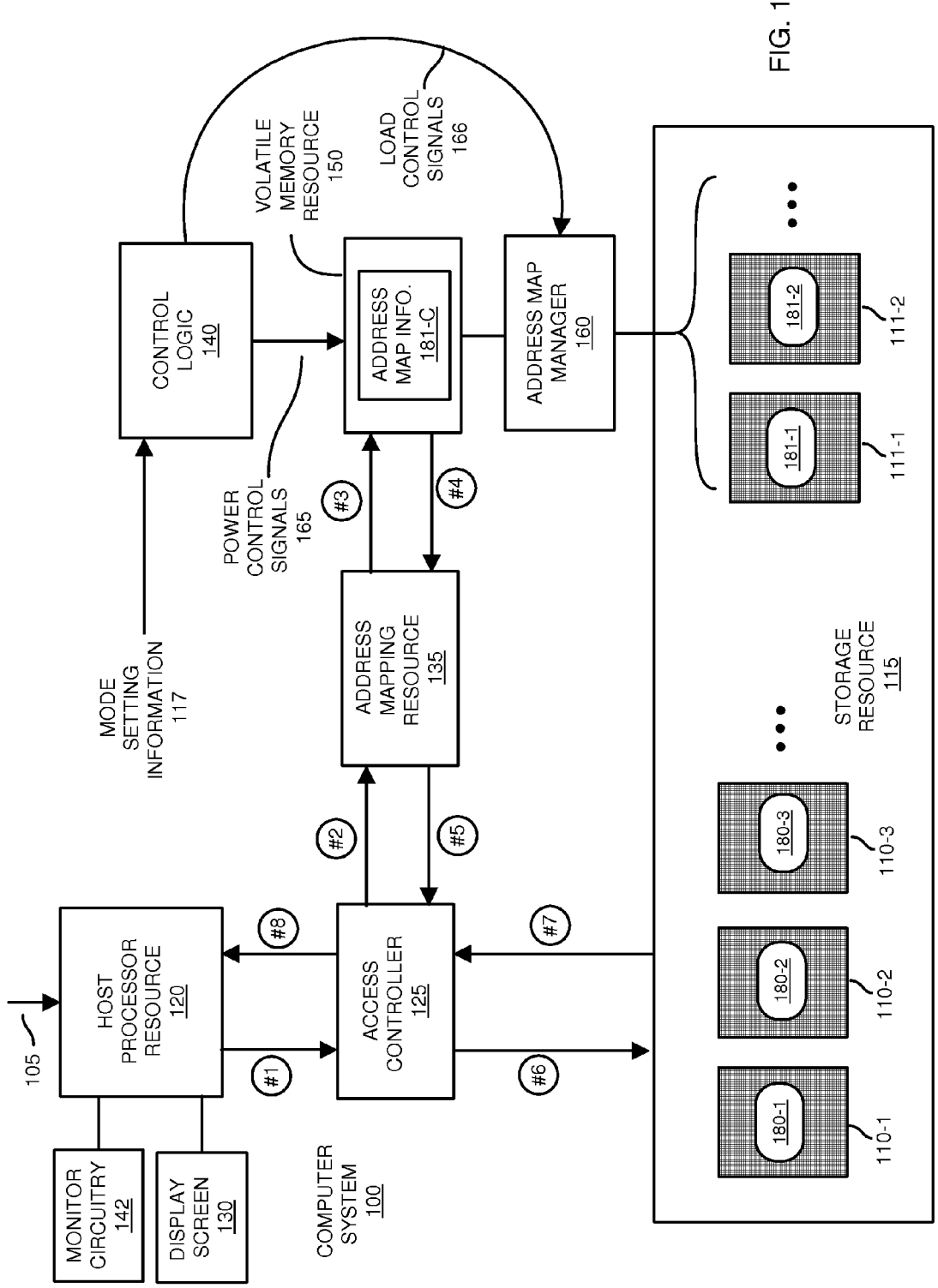
FIG. 1 is an example diagram illustrating a memory system including power control logic according to embodiments herein.

Conventional memory systems such as those including DRAM in, for example, a solid state-drive to temporarily store logical-to-physical address mapping information suffer from deficiencies. For example, as previously discussed, certain conventional solid state-drives include a sufficient number of DRAM devices to store an entire logical-to-physical address map. Copying the entire logical-to-physical address from non-volatile memory to the DRAM devices provides very high performance and QoS (Quality of Service) because there is never a miss when performing logical-to-physical address mapping. However, the conventional manner of applying continuous power to a large bank of DRAM devices can be detrimental in situations when only limited power is available. That is, continuous powering of a large bank of DRAM devices provides high performance but may quickly drain a battery.

Alternative approaches to implementing large banks of DRAM devices have been considered. For example, one conventional technique includes populating a respective memory system with fewer DRAM devices. The fewer DRAM devices are operated in a paging mode in which the logical-to-physical mapping information is retrieved and stored in the DRAM devices on an as-needed basis in a manner as previously discussed. The drawback of populating the memory system with fewer DRAM devices is the inability to operate at high performance because an entire logical-to-physical address mapping table cannot be retrieved and stored in the DRAM devices. In other words, extra time is needed to convert a logical address to a corresponding physical address when the required mapping information is not stored in the DRAM devices.

Embodiments herein include novel techniques directed to dynamically adjusting an operational mode of one or more volatile memory devices that are used to store logical-to-physical address mapping information.

More specifically, in one non-limiting example embodiment, an apparatus includes a storage resource to store data. The data can be accessible by a host computer system. The apparatus includes a set of dynamically powered volatile memory devices configured to store address mapping information. The address mapping information stored in the dynamically powered volatile memory devices correlates logical addresses of received access requests to corresponding physical addresses of the storage resource to which the access requests pertain. In accordance with received mode setting information, the controller logic adaptively controls power settings of the volatile memory devices to store the address mapping information.

In one embodiment, if an abundance of power such as 115 VAC is available, more of volatile memory devices can be powered to store a greater portion of the logical-to-physical address mapping information. If only battery power is available, fewer than all of the volatile memory devices can be powered to store a smaller portion of the logical-to-physical address mapping information. Embodiments herein can include incrementally powering additional volatile memory devices on an as-needed basis to store additional address mapping information to provide higher logical-to-physical mapping performance. Embodiments herein also can include incrementally depowering one or more volatile memory devices on an as-needed basis to reduce power consumption and a respective amount of memory that is available to store address mapping information.

Dynamic control of power settings as discussed herein is useful because it enables dynamically adjusting power and providing different levels of performance depending on parameters such as the availability of power.

Now, referring more specifically to the figures, FIG. 1 is an example diagram illustrating power control according to embodiments herein.

As shown, example computer system 100 includes a display screen 130, a host processor resource 120 (e.g., one or more processor devices), an access controller 125, an address mapper resource 135, control logic 140, volatile memory resource 150, logical-to-physical address map manager 160, and storage resource 115.

By way of a non-limiting example, storage resource 115 includes a first set of non-volatile memory devices 110 (e.g., non-volatile memory device 110-1, non-volatile memory device 110-2, non-volatile memory device 110-3, etc.) to store respective data 180 (e.g., data 180-1, data 180-2, data 180-3, etc.).

By way of a non-limiting example, storage resource 115 also includes a second set of non-volatile memory devices 111 (e.g., non-volatile memory device 111-1, non-volatile memory device 111-2, etc.) to store respective portions of address mapping information 181 (e.g., address mapping information 181-1, address mapping information 181-2, etc.).

Each of the resources disclosed in FIG. 1 can be any suitable type of resource. For example, the non-volatile memory devices 110 can represent NAND flash devices, NOR flash devices, Magnetoresistive Random Access Memory devices, Ferroelectric Random Access Memory devices, personal computer memory system, etc. In other words, non-volatile memory device 110 can be any suitable type of storage device enabling storage of data.

Note that each of the respective resources such as the control logic 140, access controller 125, address mapping resource 135, address map manager 160, etc., can be executed via any suitable type of resource such as an ASIC (Application Specific Integrated Circuit), processor executing instructions, firmware, hardware, software, etc. Further, note that the computer system 100 can include any appropriate type of logic such as hardware, software, firmware, etc., to perform the different functions (e.g., access control, address mapping, control, etc.) such as discussed herein.

As shown, computer system 100 can include host processor resource 120 and storage resource 115. As previously discussed, host processor resource 120 can be or include one or more processor devices. Note that computer system 100 can be any suitable type of resource such as a personal computer, cellular phone, mobile device, camera, etc., using memory system 100 to store data. As mentioned, by way of a non-limiting example, storage resource 115 can be a solid-state drive (i.e., SSD) to store data.

In one embodiment, the host processor resource 120 has access to storage resource 115 via a respective interface. The interface can be any suitable link enabling data transfers. For example, the interface can be a SCSI (Small Computer System Interface), SAS (Serial Attached SCSI), SATA (Serial Advanced Technology Attachment), USB (Universal Serial Bus), PCIE (Peripheral Component Interconnect Express) bus, etc.

In one embodiment, address mapping information 181 stored in volatile memory devices 111 includes a mapping of logical addresses used by the host processor resource 120 to corresponding physical addresses of locations in non-volatile memory devices 110.

As discussed herein, the control logic 140 receives mode setting information 117 indicating an operational mode of computer system 100. The computer system 100 (or other suitable resource such as a computer user, etc.) can generate the mode setting information 117 based on any of one or more parameters.

For example, in one embodiment, the computer system 100 can include power monitoring circuitry 142 to detect whether it is being powered by primary wall voltage (e.g., 120 volts AC), DC power, battery backup power, etc.

In one embodiment, the control logic dynamically adjusts how many volatile memory devices in the volatile memory resource 150 are powered depending on availability of power to power computer system 100 and/or components therein.

If the computer system 100 is operating on primary power (such as 120 VAC wall power), the mode setting information 117 can indicate to power all devices in the volatile memory resource 150 and to store a copy of as much of the logical-to-physical address mapping information 181 as possible. In such an instance, the control logic 140 generates the power control signals 165 to power substantially all of the devices in the volatile memory resource 150 to store a copy of the logical-to-physical address mapping information 181. In one embodiment, the volatile memory resource 150 includes sufficient capacity to store a copy of all or substantially all of the address mapping information 181 in volatile memory resource 150.

In accordance with one embodiment, if the computer system 100 is operating on battery backup, the mode setting information 117 indicates to power fewer than all devices in the volatile memory resource 150 to reduce power consumption. More specifically, in such an instance, the control logic 140 generates the power control signals 165 to power fewer than all of the devices in the volatile memory resource 150 to store a reduced portion of the logical-to-physical address mapping information 181.

In addition to availability of power, other parameters can be used to generate the mode setting information 117. For example, further embodiments herein can include input from a respective user indicating which level of performance the computer system 100 is to operate even though the computer system may be running off of a limited battery supply.

In one embodiment, when the mode setting information 117 indicates user selection of a high performance mode (in which the processor resource 120 is able to perform fastest access to storage resource 115), the control logic 140 powers more of the devices in volatile memory resource 150, increasing a capacity to store. When the mode setting information 117 indicates user selection of a low performance mode to save power (in which the processor resource 120 is limited to performing slower accesses to storage resource 115), the control logic 140 powers fewer of the devices in volatile memory resource 150.

In a manner as previously discussed, the adaptive control of the power settings (as captured by the power control signals 165) changes a capacity of available memory in the volatile memory resource that is available to store the address mapping information 181. Additionally, note that the control logic 140 or other suitable resource can generate appropriate control signals 166 to initiate a transfer of any portion or all of the address mapping information 181 (as a copy of address mapping information 181-C) in volatile memory resource 150 as additional volatile memory resources are newly powered.

In a specific embodiment, in addition to dynamically adjusting power control signals 165 depending on mode setting information 117, the control logic 140 can be configured to generate load control signals 166 to control loading of a copy of address mapping information 181-C into volatile memory resource 150. For example, the logical-to-physical address map manager 160 can be configured to receive load control signals 166 and/or mode setting information 117. In accordance with received information, the address map manager 160 initiates a transfer of all or a portion of the address mapping information 181 stored in non-volatile memory devices 111 to available memory space in volatile memory resource 150. As mentioned, the available capacity to store address mapping information 181 into volatile memory resource 150 varies depending on how many of the volatile memory devices are powered.

By way of a non-limiting example, the storage resource 115 can be a solid-state drive to which the host processor resource 120 (e.g., one or more processing devices) of computer system 100 has access to stored data through access controller 125. As discussed above, the access controller 125 and/or address mapping resource 135 can be configured to utilize a copy of the address mapping information 181-C in dynamically powered volatile memory resource 150 to convert the logical addresses associated with the access requests to the corresponding physical addresses of the solid state drive to which the access requests pertain.

More specifically, assume in this example that a user operating computer system 100 provides input 105 to host processor resource 120 indicating to display information on display screen 130. In one embodiment, based at least in part on the data 110 stored in the storage resource 115, the host processor resource 120 renders an image on display screen 130.

By way of a non-limiting example, to access data in accordance with flow #1 (e.g., arrow from host processor resource 120 to access controller 125), the host processor resource 120 forwards an access request to access controller 125.

Access controller 125 extracts a logical address associated with the access request and forwards the logical address in flow #2 to address mapping resource 135.

In flow #3, the address mapper resource 135 initiates conversion of the logical address to a corresponding physical address in the storage resource 115 where data associated with the logical address is stored.

In flow #4, using the copy of logical-to-physical address mapping information 181-C stored in volatile memory resource 150, the address mapper resource 135 receives the physical address corresponding to the logical address in the access request.

In flow #5, the address mapper resource forwards the physical address associated with the logical address to access controller 125.

In flow #6, the access controller 125 then uses the received physical address to access an appropriate memory storage location to retrieve data stored in storage resource 115.

In flow #7, the access controller 125 receives corresponding data stored at the physical address.

In flow #8, the access controller forwards the retrieved data (corresponding to the logical address in the access request) to the host processor resource 120.

The host processor resource 120 then uses the retrieved data to perform an appropriate function such as initiate display of an image on display screen 130 using the retrieved data.

Note that the above example illustrates how data can be accessed from storage resource 115. However, note that a similar process can be used to WRITE data to an appropriate location in storage resource 115. That is, the host processor resource 120 can be configured to forward a logical address and corresponding data to store in storage resource 115. In a similar manner as previously discussed, the address mapping resource converts the logical address of the WRITE request to a corresponding physical location in the storage resource 115. The access controller 135 then initiates writing of the data to the corresponding physical location in the storage resource 115.

Upon powering the computer system 100 and volatile memory resource 150 down, the address mapping information stored in volatile memory resource 150 may be lost. Thereafter, when the computer system 100 is powered up again, the control logic 140 would initiate powering an appropriate number of devices in the volatile memory resource 150 and reload an appropriate portion of the address mapping information from non-volatile memory devices 111 to volatile memory resource 150. Thus, one or more dynamically powered volatile memory devices in volatile memory resource 150 can be used to at least temporarily store a portion of the address mapping information 181 stored in the multiple non-volatile memory devices 111.

Figure 2:
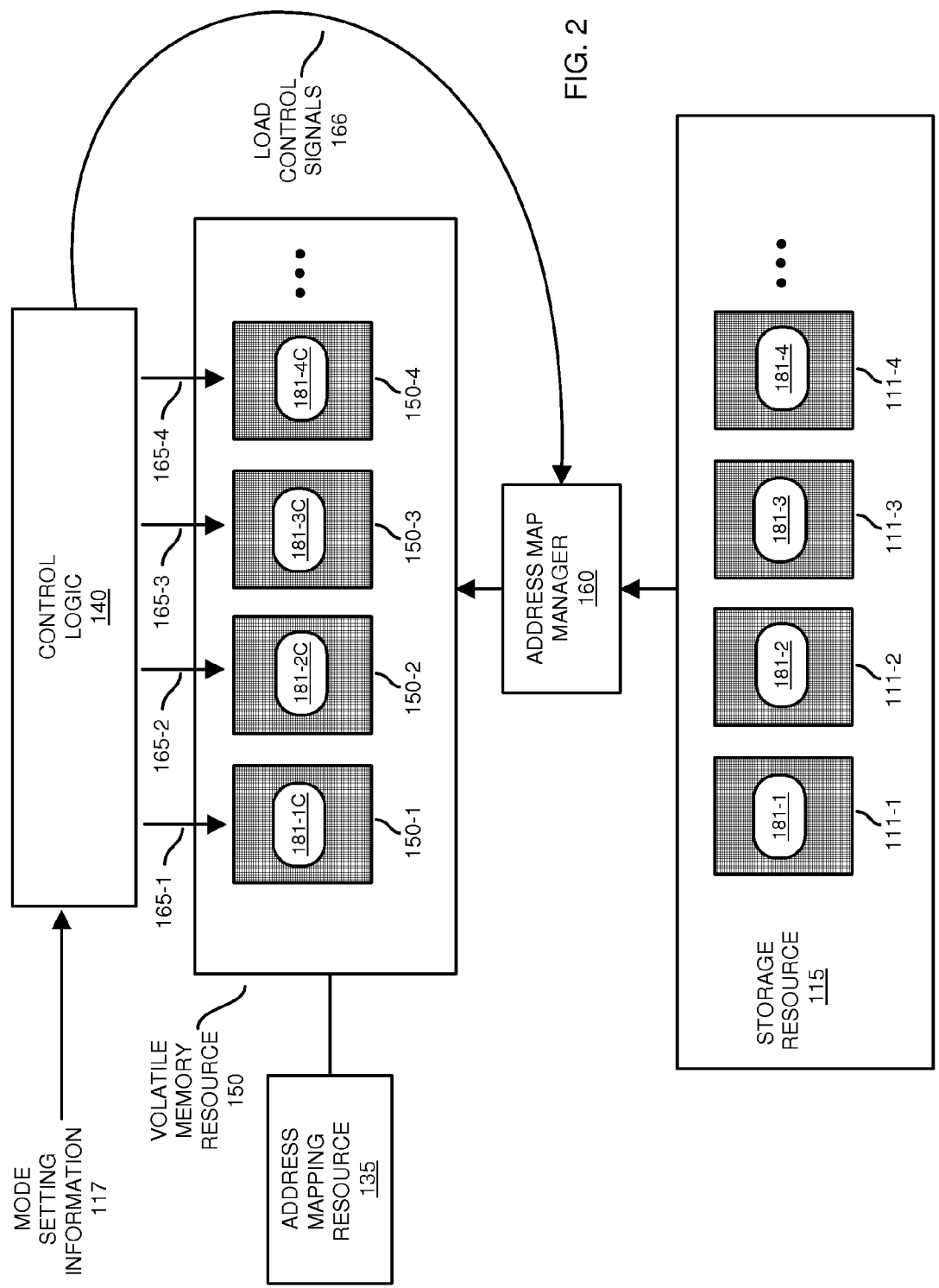
FIGS. 2-4 are example diagrams illustrating dynamic powering of one or more non-volatile memory devices to store address-mapping information according to embodiments herein.

FIG. 2 is an example diagram illustrating dynamic powering of one or more non-volatile memory devices to store address-mapping information according to embodiments herein.

As shown in this example embodiment, the volatile memory resource 150 includes a set of volatile memory devices including volatile memory device 150-1, volatile memory device 150-2, volatile memory device 150-3, volatile memory device 150-4, etc. (collectively, volatile memory devices 150).

In this example embodiment, assume that the mode setting information 117 indicates to operate the computer system 100 at a high level of performance in a so-called linear mode in which an entire copy (or substantially entire copy) of the address mapping information 181 is stored in the volatile memory resource 150 as address mapping information 181-1C, 181-2C, 181-3C, etc.

In such an instance, as previously discussed, the control logic 140 generates respective power control signals 165 to power up substantially all of the memory devices 150. For example, the control logic 140 generates power control signals 165-1 to power the volatile memory device 150-1; the control logic 140 generates power control signals 165-2 to power the volatile memory device 150-2; the control logic 140 generates power control signals 165-3 to power the volatile memory device 150-3; the control logic 140 generates power control signals 165-4 to power the volatile memory device 150-4; and so on. In one embodiment, the control signals 165 represent the actual voltage to power the respective volatile memory devices in volatile memory resource 150. In accordance with other embodiments, the control signals are used as enable/disable signals causing another circuit to power and/or depower the respective memory devices.

In one embodiment, as previously discussed, the control logic 140 also generates load control signals 166 to notify address map manager 160 to: store a copy of address mapping information 181-1 in volatile memory device 150-1 as address mapping information 181-1C; store a copy of address mapping information 181-2 in volatile memory device 150-2 as address mapping information 181-2C; store a copy of address mapping information 181-3 in volatile memory device 150-3 as address mapping information 181-3C; store a copy of address mapping information 181-4 in volatile memory device 150-4 as address mapping information 181-4C; and so on.

Note that the manner of copying address mapping information 181 is shown by way of non-limiting example only and that the address mapping information 181 stored in memory devices 111 can be logically divided and stored in respective memory devices 181 in any suitable manner.

As previously discussed, the control logic 140 can receive updated mode setting information 117 indicating to operate in a reduced power mode. In such an instance, the control logic 140 initiates de-powering of at least one currently powered volatile memory device in volatile memory resource 150 in response to detecting a change in the mode setting information 117.

Figure 3:
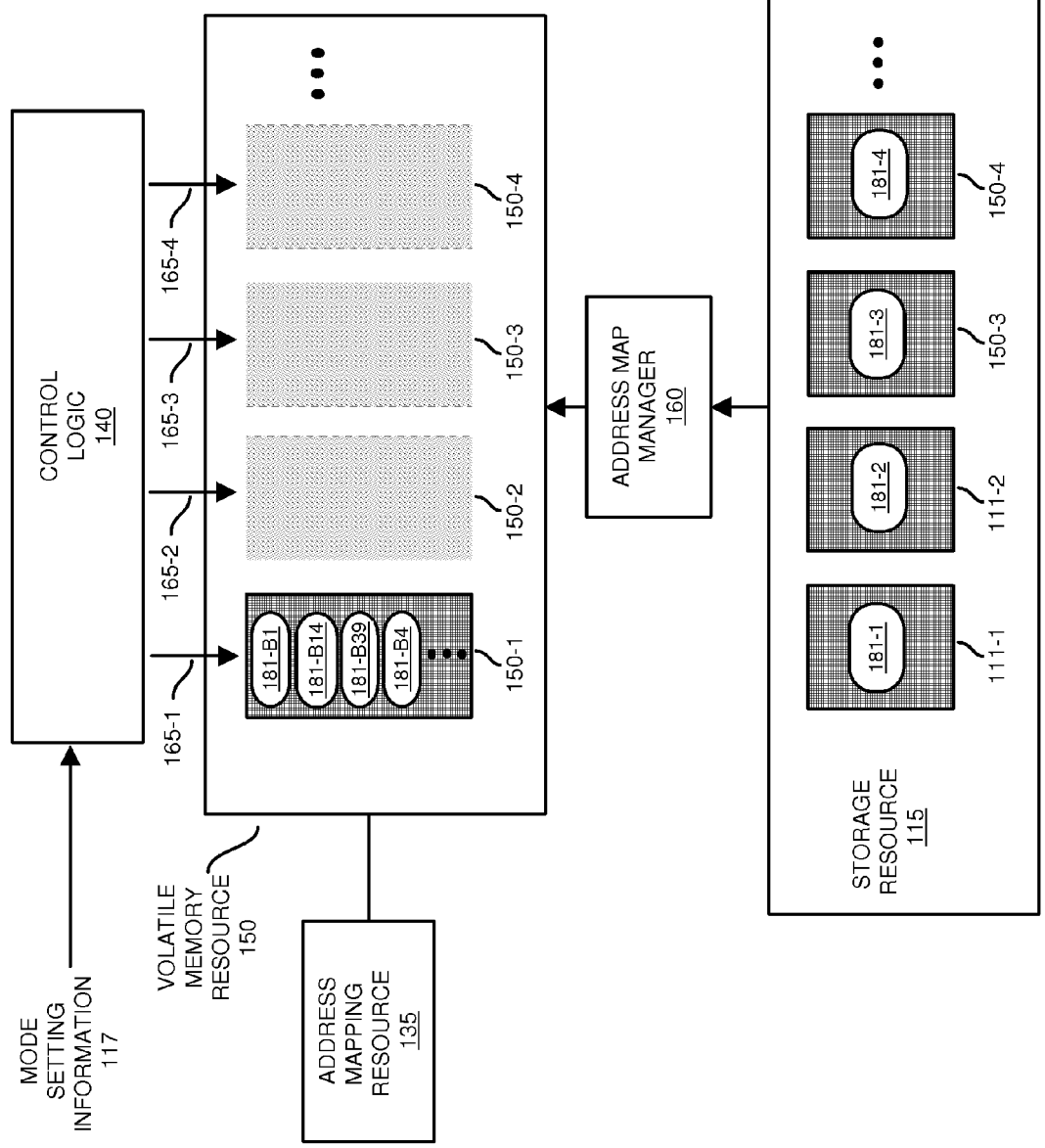

FIG. 3 is an example diagram illustrating dynamic powering of one or more non-volatile memory devices to store address-mapping information according to embodiments herein.

In this example embodiment, in accordance with the mode setting information 117 to operate in a reduced power consumption mode, the control logic 140 generates power control signal 165-2, power control signal 165-3, power control signals 165-4, etc., to discontinue providing power to volatile memory device 150-2, volatile memory device 150-3, volatile memory device 150-4, etc. In such an instance, depowering the volatile memory devices 150-2, 150-3, 150-4, causes such devices to lose previously stored data.

Assume in this example embodiment that control logic 140 generates power control signal 165-1 to continue to power volatile memory device 150-1.

When depowering the volatile memory devices 150-2, 150-3, 150-4, etc., the control logic 140 can further initiate switchover to operating in a paging mode as opposed to operating in the linear mode as discussed above. For example, in the paging mode, the address mapper resource 135 accesses the blocks or pages of address mapping information 181-B1, 181-B14, 181-B39, 181-B4, etc., on an as-needed basis. If the address mapping information stored in the volatile memory device 150-1 does not store the appropriate address mapping information needed to perform a conversion of a logical address to a corresponding physical address, the address map manager 160 initiates retrieval of the appropriate portion of address mapping information for storage in volatile memory device 150-1. Oldest stored address mapping information or least used address mapping information stored in the volatile memory device 150-1 can be overwritten with the new data.

Thus, according to embodiments herein, the control logic 140 can set at least one of the multiple volatile memory devices (e.g., volatile memory device 150-1 in this instance) to operate in a paging mode during a respective power mode in which fewer than all but at least one of the volatile memory devices is powered to store the address mapping information. In contrast, when operating in the linear mode as discussed above, the control logic 140 can be configured to control the multiple volatile memory devices to operate in a non-paging mode during a second power mode in which two or more of the volatile memory devices are powered to store the address mapping information.

In the linear mode, the volatile memory resource 150 (and any corresponding powered volatile memory devices 150) has a capacity to store a first amount of address mapping information. In the power reduction mode, the volatile memory resource 150 (and any corresponding powered volatile memory devices 150) has a capacity to store a second amount of address mapping information. Because volatile memory devices are depowered, the second capacity can be substantially less than the first capacity. In other words, reducing the number of powered volatile memory devices in volatile memory resource 150 reduces a capacity of space available to store the address mapping information.

In accordance with further embodiments, the control logic 140 can be configured to initiate incremental powering of one or more additional volatile memory devices in volatile memory resource 150 in response to detecting change in mode setting information 117 such as an increase in an availability of power to the volatile memory devices.

Figure 4:
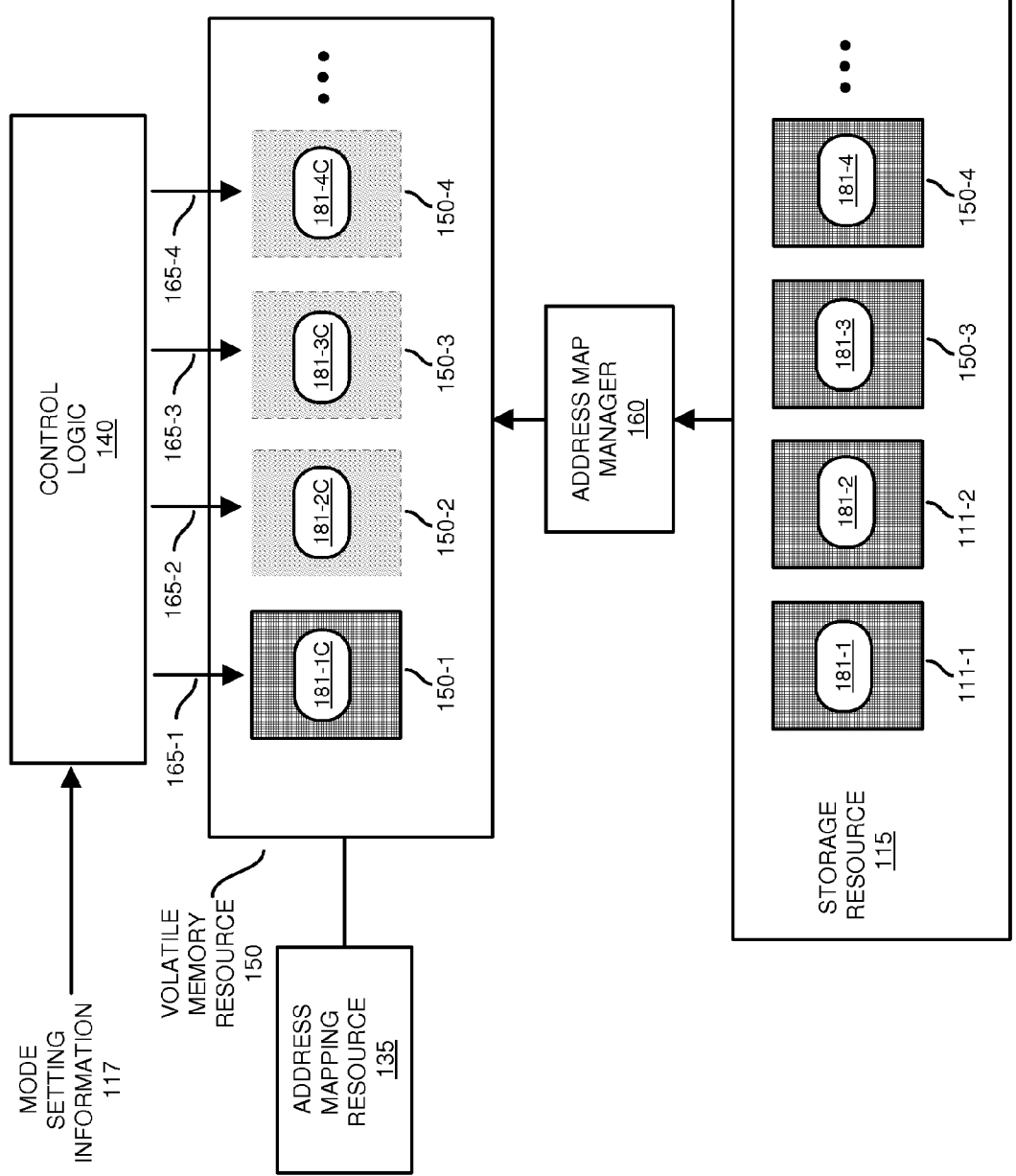

FIG. 4 is an example diagram illustrating dynamic powering of one or more non-volatile memory devices to store address-mapping information according to embodiments herein.

In a manner as previously discussed, the control logic 140 can dynamically adjust how many of the volatile memory devices in volatile memory resource 150 are powered depending on one or more different types of input.

Note that reducing power consumption of the respective memory devices 150-2, 150-3, 150-4, can be achieved by placing such devices in a standby mode instead of de-powering the devices and losing all stored data. For example, as shown in FIG. 4, the control logic 140 can generate power control signals 165-1 to power volatile memory device 150-1 and configure it to operate in an active mode during which the address mapping resource 135 can access stored address mapping information.

To save power, rather than completely depowering the respective volatile memory devices causing loss of data, the control logic 140 as discussed herein can generate power control signal 165-2 to continue powering volatile memory device 150-2, but configure the volatile memory device 150-2 to operate in a standby mode during which the address mapping resource 135 cannot access stored address mapping information; the control logic 140 as discussed herein can generate power control signal 165-3 to continue powering volatile memory device 150-3, but configure the volatile memory device 150-3 to operate in a standby mode during which the address mapping resource 135 cannot access stored address mapping information; the control logic 140 as discussed herein can generate power control signals 165-4 to continue powering volatile memory device 150-4, but configure the volatile memory device 150-4 to operate in a standby mode during which the address mapping resource 135 cannot access stored address mapping information; and so on.

Thus, in accordance with embodiments herein, the control logic 140 can be configured to set at least one of the multiple volatile memory devices in a standby mode to reduce power consumption.

In one embodiment, the control logic 140 can place each of one or more of the volatile memory devices in a standby mode depending on whether there has been a recent access to the volatile memory device to perform a logical-to-physical address conversion as discussed herein. By way of a non-limiting example, the control logic 140 can set a respective volatile memory device in a standby mode in response to occurrence of a condition in which address mapping information stored in the respective volatile memory device has not been accessed for a threshold amount of time.

When there is an access request that requires address mapping information stored in a volatile memory device in the standby mode, the control logic 140 switches the respective volatile memory device to the active mode in which the stored address mapping information can again be accessed. In one embodiment, the control logic 140 switches the volatile memory devices 150-1, 150-2, 150-3, 150-4, etc., between active and standby modes on an as-needed basis.

Figure 5:
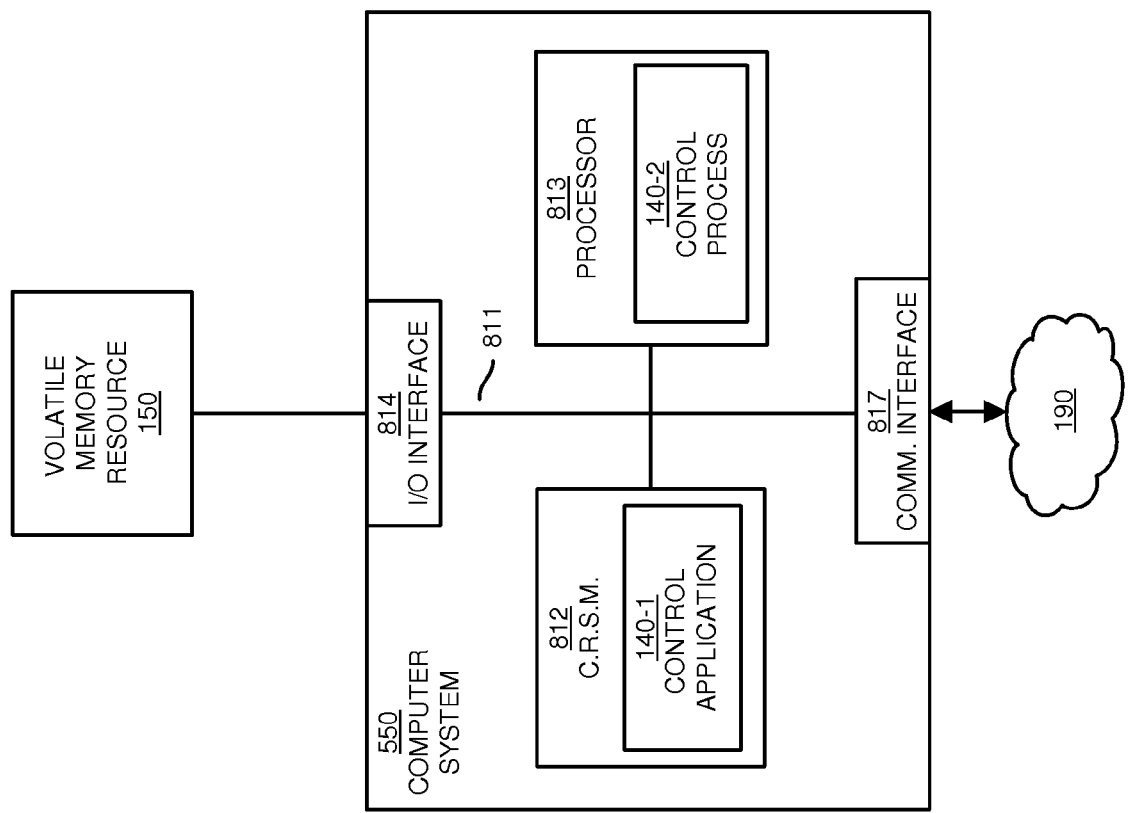
FIG. 5 is an example diagram illustrating a computer system on which to execute a controller application according to embodiments herein.

FIG. 5 is an example block diagram of a computer system for implementing any of the operations as discussed herein according to embodiments herein.

Computer system 550 (such as an implementation of computer system 100) can be configured to execute any of the operations with respect to processor resource 120, access controller 125, control logic 140, address map manager 160, address mapper resource 135, access controller 125, etc.

As shown, computer system 550 of the present example includes an interconnect 811 that couples computer readable storage media 812 such as a non-transitory type of media (i.e., any type of hardware storage medium) in which digital information can be stored and retrieved, a processor 813 (i.e., one or more processor devices), I/O interface 814, and a communications interface 817.

I/O interface 814 provides connectivity to volatile memory resource 150 such as a one or more volatile memory devices 150-1, 150-2, 150-3, etc.

Computer readable storage medium 812 can be any hardware storage device such as memory, optical storage, hard drive, floppy disk, etc. In one embodiment, the computer readable storage medium 812 (e.g., a computer readable hardware storage) stores instructions and/or data.

Communications interface 817 enables the computer system 550 and processor 813 to communicate over a resource such as network 190 to retrieve information from remote sources and communicate with other computers. I/O interface 814 enables processor 813 to retrieve stored information from a repository such as memory devices 110.

As shown, computer readable storage media 812 is encoded with control application 140-1 (e.g., software, firmware, etc.) executed by processor 813. Control application 140-1 can be configured to include instructions to implement any of the operations as discussed herein.

During operation of one embodiment, processor 813 accesses computer readable storage media 812 via the use of interconnect 811 in order to launch, run, execute, interpret or otherwise perform the instructions in control application 140-1 stored on computer readable storage medium 812.

Execution of the control application 140-1 produces processing functionality such as control process 140-2 in processor 813. In other words, the control process 140-2 associated with processor 813 represents one or more aspects of executing control application 140-1 within or upon the processor 813 in the computer system 550.

Those skilled in the art will understand that the computer system 550 can include other processes and/or software and hardware components, such as an operating system that controls allocation and use of hardware resources, software resources, etc., to execute control application 140-1.

In accordance with different embodiments, note that computer system 550 may be any of various types of devices, including, but not limited to, a mobile computer, a personal computer system, a wireless device, base station, phone device, desktop computer, laptop, notebook, netbook computer, mainframe computer system, handheld computer, workstation, network computer, application server, storage device, a consumer electronics device such as a camera, camcorder, set top box, mobile device, video game console, handheld video game device, a peripheral device such as a switch, modem, router, or in general any type of computing or electronic device.

Functionality supported by the different resources will now be discussed via flowcharts in FIG. 6. Note that the processing in the flowcharts below can be executed in any suitable order.

Figure 6:
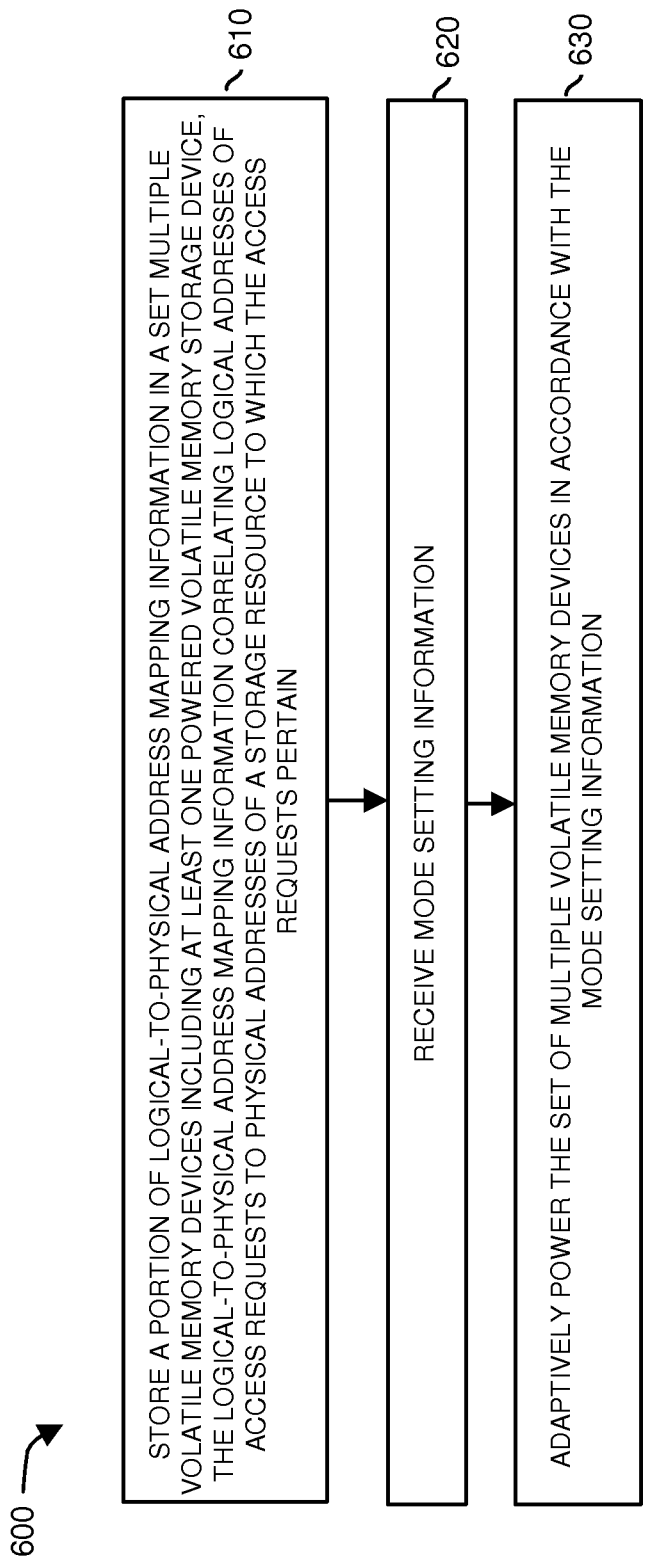
FIG. 6 is an example flowchart illustrating a method of dynamically powering a volatile storage resource according to embodiments herein.

FIG. 6 is a flowchart 600 illustrating an example method according to embodiments. Note that there will be some overlap with respect to concepts as discussed above.

In processing block 610, control logic 140 initiates storage of a portion of logical-to-physical address mapping information in a set multiple volatile memory devices including at least one powered volatile memory storage device. The logical-to-physical address mapping information correlates (i.e., maps) logical addresses of access requests to physical addresses of a storage resource to which the access requests pertain.

In processing block 620, control logic 140 receives mode setting information 117.

In processing block 630, the control logic 140 adaptively powers the set of multiple volatile memory devices in the volatile memory resource 150 in accordance with the mode setting information 117.

Different Permutations of Disclosed Example Embodiments

A first example embodiment as discussed herein includes an apparatus, the apparatus comprises: a storage resource to store data; a set of dynamically powered volatile memory devices to store address mapping information correlating logical addresses of received access requests to corresponding physical addresses of the storage resource to which the access requests pertain; and control logic configured to: receive mode setting information; and adaptively control power settings of the volatile memory devices depending on the mode setting information.

The first example embodiment can be implemented along with any of one or more of the following features to produce yet different embodiments:

For example, in accordance with a further embodiment, the storage resource can be a solid-state drive including multiple non-volatile memory devices to store the data. The address mapping information can be logical-to-physical address mapping information stored in the volatile memory devices.

In accordance with a further embodiment, at least a portion of the multiple non-volatile memory devices in the solid-state drive can be allocated to store an original copy of the address mapping information. The dynamically powered volatile memory devices temporarily store at least a portion of a copy of the address mapping information stored in the portion of the multiple non-volatile memory devices.

In addition to controlling the power settings of the multiple volatile memory devices, the control logic can be configured to control retrieval and storage of the address mapping information in the multiple volatile memory devices depending at least in part on the received mode setting information.

In accordance with further embodiments, first mode setting information received by the control logic indicates to power all of the multiple volatile memory devices for storage of a first amount of address mapping information. The control logic, as specified by second received mode setting information to reduce power consumption with respect to the first mode setting information, indicates to depower at least one but fewer than all of the multiple volatile memory devices in the set for storage of a second amount of address mapping information. In one embodiment, the second amount of address mapping information is less than the first amount of address mapping information.

In yet further embodiments, the control logic, based on first received mode setting information indicating to operate in a reduced power consumption mode, depowers at least one but fewer than all of the multiple volatile memory devices for storage of a first amount of address mapping information. Based on second received mode setting information, the control logic powers substantially all of the multiple volatile memory devices for storage of a second amount of address mapping information. Thus, in one embodiment, the control logic dynamically adjusts how many of the volatile memory devices are powered depending on availability of power, performance mode settings, etc.

The apparatus can include at least one host processor device from which to receive the access requests to the storage resource. An access controller receives the access requests from the at least one host processor device and utilizes the address mapping information in the set of dynamically powered volatile memory devices to convert logical addresses associated with received access requests to corresponding physical addresses of the storage resource to which the access requests pertain.

The control logic can be configured to set one or more of the multiple volatile memory devices to operate in a paging mode during a first power mode in which fewer than all but at least one of the volatile memory devices is powered to store the address mapping information. The control logic can be configured to set the multiple volatile memory devices to operate in a non-paging mode (such as a so-called linear mode) during a second power mode in which all of the volatile memory devices are powered to store the address mapping information.

Additionally, the control logic can be configured to set one or more of the multiple volatile memory devices in a standby mode to reduce power consumption. The control logic can set the one or more volatile memory devices into the standby mode in response to occurrence of a condition in which address mapping information stored in the at least one volatile memory device has not been accessed for a threshold amount of time.

In yet another embodiment, the control logic can be configured to initiate powering of an additional one or more of the volatile memory devices in the set in response to detecting an increase in an availability of power to power the volatile memory devices or that a user would like to operate in a higher performance mode. The control logic can be configured to initiate depowering of at least one currently powered volatile memory device in the set in response to detecting a decrease in an availability of power to the volatile memory devices or that a user would like to operate in a lower power mode.

A second example embodiment as discussed herein includes a method, the method comprises: storing a portion of logical-to-physical address mapping information in a set multiple volatile memory devices including at least one powered volatile memory storage device. In one embodiment, the logical-to-physical address mapping information correlates logical addresses of access requests to physical addresses of a storage resource to which the access requests pertain. The method further comprises receiving mode setting information; and adaptively powering the set of multiple volatile memory devices in accordance with the mode setting information.

The second example embodiment can be implemented along with any of one or more of the following features to produce yet further embodiments:

In one embodiment, adaptively powering the set of volatile memory devices varies an amount of storage space that is available to store the portion of logical-to-physical address mapping information.

In accordance with another embodiment, the method includes accessing a full copy of the logical-to-physical address mapping information in a non-volatile repository; and varying the portion (i.e., how much of) the full copy of the logical-to-physical address mapping information is retrieved from the non-volatile repository and store in the set depending on how many of the multiple volatile memory devices in the set are powered.

In yet further method embodiments, the received mode setting information indicates to increase a number of the volatile memory devices in the set that are powered. Adaptively powering the set of multiple volatile memory devices can include increasing a number of the volatile memory devices that are powered in the set in accordance with the received mode setting information.

In one embodiment, the received mode setting information indicates to decrease a number of the volatile memory devices in the set that are currently powered. Adaptively powering the set of multiple volatile memory devices can include, as specified by received mode setting information, decreasing a number of the volatile memory devices that are powered in the set in accordance with the received mode setting information.

Further method embodiments as discussed herein include: receiving the access requests to the storage resource from one or more host processor devices; and utilizing at least a portion of address mapping information in the set of dynamically powered volatile memory devices to convert logical addresses associated with received access requests to corresponding physical addresses of the storage resource to which the access requests pertain.

In accordance with another embodiment, the method includes: receiving an additional access request; and in response to detecting that the portion of the address mapping information currently stored in the set of powered volatile memory devices does not include an entry to convert a logical address of the additional access request to a corresponding physical address, initiating retrieval of address mapping information including the entry from the non-volatile repository and storing the retrieved address mapping information including the entry in the set of powered volatile memory devices.

Receiving mode setting information can includes receiving notification to power different numbers of volatile memory devices in the set in accordance with availability of power.

As previously discussed, method embodiments can include operating at least one dynamically powered volatile memory device in the set in a paging mode versus a non-paging mode in accordance with the mode setting information.

Also, as previously discussed, adaptively powering the set of multiple volatile memory devices in accordance with the mode setting information can includes setting at least one volatile memory device of the multiple volatile memory devices in the set to a standby mode to reduce power consumption of the at least one volatile memory device.

A third example embodiment as discussed herein includes an apparatus, the apparatus comprises: i) multiple dynamically powered volatile memory devices to store state information (such as logical-to-physical address mapping information) of a device and ii) control logic. The control logic is configured to: receive mode setting information; and adaptively control power settings of the volatile memory devices depending on the mode setting information. Embodiments herein are applicable beyond use in storage devices and logical-to-physical mappings.

In one example embodiment, the control logic dynamically adjusts how many of the volatile memory devices are powered depending on a type of power available (e.g., AC power, DC power, etc.) to power the multiple dynamically powered volatile memory devices.

In accordance with another embodiment, the control logic dynamically adjusts how many of the volatile memory devices are powered depending on the source (e.g., battery or wall) of power.

Any of the resources as discussed herein can include one or more computerized devices, servers, base stations, wireless communication equipment, communication management systems, workstations, handheld or laptop computers, or the like to carry out and/or support any or all of the method operations disclosed herein. In other words, one or more computerized devices or processors can be programmed and/or configured to operate as explained herein to carry out different embodiments.

Yet other embodiments herein include software programs, firmware, logic, etc. to perform operations as disclosed herein. One such embodiment comprises a computer program product including a non-transitory computer-readable storage medium (i.e., any computer readable hardware storage medium) on which software instructions are encoded for subsequent execution. The instructions, when executed in a computerized device having one or more processors, program and/or cause the processor to perform the operations disclosed herein. Such arrangements can be provided as software, firmware, code, instructions, data (e.g., data structures), etc., arranged or encoded on a non-transitory computer readable storage medium such as an optical medium (e.g., CD-ROM), floppy disk, hard disk, memory, etc., or other a medium such as firmware or shortcode in one or more ROM, RAM, PROM, etc., or as logic in an Application Specific Integrated Circuit (ASIC), etc. The software or firmware or other such configurations can be installed onto a computerized device to cause the computerized device to perform the techniques explained herein.

Accordingly, embodiments herein are directed to an apparatus, a method, a system, a computer program product, etc., that supports operations as discussed herein.

One embodiment includes a computer readable storage medium and/or system having instructions, logic, etc., stored thereon to manage configuration of a memory system including one or more non-volatile memory devices. The instructions, and/or logic, when executed by at least one processor device of a respective computer, cause the at least one processor device to: store a portion of logical-to-physical address mapping information in a set multiple volatile memory devices including at least one powered volatile memory storage device, the logical-to-physical address mapping information correlating logical addresses of access requests to physical addresses of a storage resource to which the access requests pertain; receive mode setting information; and adaptively powering the set of multiple volatile memory devices in accordance with the mode setting information.

Note that any of the processing as discussed herein can be performed in any suitable order.

It is to be understood that the apparatus, system, method, instructions stored on computer readable storage media, etc., as discussed herein also can be embodied strictly as a software program, firmware, as a hybrid of software, hardware and/or firmware, or as hardware alone such as within a processor device, within an operating system, within a software application, etc.

Additionally, note that although each of the different features, techniques, configurations, etc., herein may be discussed in different places of this disclosure, it is intended, where suitable, that each of the concepts can optionally be executed independently of each other or in combination with each other. Any permutation of the disclosed features is possible. Accordingly, the one or more embodiments as described herein can be embodied and viewed in many different ways.

Note further that techniques herein are well suited for dynamically adjusting power settings of respective storage resources used to store logical-to-physical address mapping information. However, it should be noted that embodiments herein are not limited to use in such applications and that the techniques discussed herein are well suited for other applications as well.

While specific embodiments have been particularly shown and described, it will be understood by those skilled in the art that various changes in form and details may be made therein without departing from the spirit and scope of the present application as defined by the appended claims. Such variations are intended to be covered by the scope of this present application. As such, the foregoing description of embodiments of the present application is not intended to be limiting. Rather, any limitations to the embodiments herein are presented in the following claims.

The invention claimed is:

1. An apparatus comprising:
a set of dynamically powered volatile memory devices to store address mapping information correlating logical addresses of received access requests to corresponding physical addresses of a storage resource to which the access requests pertain;
control logic configured to:
receive mode setting information; and
adaptively control power settings of the volatile memory devices depending on the mode setting information.

2. The apparatus as in claim 1, wherein the storage resource is a solid state drive including multiple non-volatile memory devices to store the data; and
wherein the address mapping information stored in the volatile memory devices includes a mapping of the logical addresses to corresponding physical address of the multiple non-volatile memory devices.

3. The apparatus as in claim 2, wherein at least a portion of the multiple non-volatile memory devices in the solid state drive is allocated to store an original copy of the address mapping information; and
wherein the dynamically powered volatile memory devices at least temporarily store at least a portion of a copy of the address mapping information stored in the portion of the multiple non-volatile memory devices.

4. The apparatus as in claim 3, wherein the multiple non-volatile memory devices in the solid-state drive are flash memory devices.

5. The apparatus as in claim 1, wherein the control logic, as specified by first received mode setting information, is configured to power all of the multiple volatile memory devices for storage of a first amount of address mapping information; and wherein the control logic, as specified by second received mode setting information to reduce power consumption with respect to the first mode setting information, is configured to depower at least one but fewer than all of the multiple volatile memory devices in the set for storage of a second amount of address mapping information, the second amount of address mapping information less than the first amount of address mapping information.

6. The apparatus as in claim 1, wherein the control logic, based on first received mode setting information indicating to operate in a reduced power consumption mode, depowers at least one but fewer than all of the multiple volatile memory devices for storage of a first amount of address mapping information; and wherein the control logic, based on second received mode setting information, powers substantially all of the multiple volatile memory devices for storage of a second amount of address mapping information, the second amount of address mapping information greater than the first amount of address mapping information.

7. The apparatus as in claim 1 further comprising:
at least one host processor device from which to receive the access requests to the storage resource; and
an access controller configured to receive the access requests from the at least one host processor device, the access controller utilizing the address mapping information in the set of dynamically powered volatile memory devices to convert logical addresses associated with received access requests to corresponding physical addresses of the storage resource to which the access requests pertain.

8. The apparatus as in claim 1, wherein the control logic is configured to control retrieval and storage of the address mapping information in the multiple volatile memory devices depending at least in part on the received mode setting information.

9. The apparatus as in claim 8, wherein the control logic is configured to set at least one of the multiple volatile memory devices to operate in a paging mode during a first power mode in which fewer than all but at least one of the volatile memory devices is powered to store the address mapping information; and wherein the control logic is configured to set the multiple volatile memory devices to operate in a non-paging mode during a second power mode in which all of the volatile memory devices are powered to store the address mapping information.

10. The apparatus as in claim 1, wherein the control logic is configured to set at least one of the multiple volatile memory devices in a standby mode to reduce power consumption of the at least one volatile memory device in response to occurrence of a condition in which address mapping information stored in the at least one volatile memory device has not been accessed for a threshold amount of time.

11. The apparatus as in claim 1, wherein the adaptive control of the power settings changes a capacity of available memory in the volatile memory devices to store the address mapping information.

12. The apparatus as in claim 1, wherein the control logic, as specified by first received mode setting information, powers a first portion of the multiple volatile memory devices for storage of up to a first amount of address mapping information; and wherein the control logic, as specified by second received mode setting information, powers a second portion of the multiple volatile memory devices for storage of a second amount of address mapping information;

wherein the second portion is greater than the first portion; and wherein the second amount of address mapping information is greater than the first amount of address mapping information.

13. The apparatus as in claim 1, wherein the control logic dynamically adjusts how many of the volatile memory devices are powered depending on availability of power.

14. The apparatus as in claim 13, wherein the control logic is configured to initiate powering of an additional one of the volatile memory devices in the set in response to detecting an increase in an availability of power to power the volatile memory devices.

15. The apparatus as in claim 13, wherein the control logic is configured to initiate depowering of at least one currently powered volatile memory device in the set in response to detecting a decrease in an availability of power to power the volatile memory devices.

16. A computer system including the apparatus in claim 1, the computer system further comprising:
a display screen on which to render an image based at least in part on the data stored in the storage resource.

17. The computer system as in claim 16, wherein the storage resource is a solid state drive to which the computer system has access through an access controller, the access controller utilizing the address mapping information to convert the logical addresses a associated with the access requests to the corresponding physical addresses of the solid state drive to which the access requests pertain.

18. A method comprising:
initiating storage of a portion of logical-to-physical address mapping information in a set multiple volatile memory devices including at least one powered volatile memory storage device, the logical-to-physical address mapping information correlating logical addresses of access requests to physical addresses of a storage resource to which the access requests pertain;
receiving mode setting information; and
adaptively powering the set of multiple volatile memory devices in accordance with the mode setting information.

19. The method as in claim 18, wherein adaptively powering the set of volatile memory devices varies an amount of storage space that is available to store the portion of logical-to-physical address mapping information.

20. The method as in claim 18 further comprising:
accessing a full copy of the logical-to-physical address mapping information in a non-volatile repository; and
varying the portion of the full copy of the logical-to-physical address mapping information to retrieve from the non-volatile repository and store in the set depending on how many of the multiple volatile memory devices in the set are powered.

21. The method as in claim 18, wherein the received mode setting information indicates to increase a number of the volatile memory devices in the set that are powered; and wherein adaptively powering the set of multiple volatile memory devices includes increasing a number of the volatile memory devices that are powered in the set in accordance with the received mode setting information.

22. The method as in claim 18, wherein the received mode setting information indicates to decrease a number of the volatile memory devices in the set that are currently powered; and wherein adaptively powering the set of multiple volatile memory devices includes decreasing a number of the volatile memory devices that are powered in the set in accordance with the received mode setting information.

23. The method as in claim 20 further comprising:
receiving the access requests to the storage resource from a host processor device;
utilizing the portion of address mapping information in the set of adaptively powered volatile memory devices to convert logical addresses associated with received access requests to corresponding physical addresses of the storage resource to which the access requests pertain.

24. The method as in claim 23 further comprising:
receiving an additional access request; and
in response to detecting that the portion of the address mapping information currently stored in the set of powered volatile memory devices does not include an entry to convert a logical address of the additional access request to a corresponding physical address, initiating retrieval of address mapping information including the entry from the non-volatile repository and storing the retrieved address mapping information including the entry in the set of powered volatile memory devices.

25. Computer-readable storage hardware having instructions stored thereon, the instructions, when carried out by at least one processing device, cause the at least one processing device to perform operations of:
storing logical-to-physical address mapping information in a set multiple volatile memory devices including at least one powered volatile memory storage device, the logical-to-physical address mapping information correlating logical addresses of access requests to physical addresses of a storage resource to which the access requests pertain;
receiving mode setting information; and
adaptively controlling power to the set of multiple volatile memory devices in accordance with the mode setting information.

26. The computer readable storage hardware as in claim 25, wherein adaptively controlling power to the set of volatile memory devices varies an amount of storage space that is available to store the logical-to-physical address mapping information.

* * * * *